(12) United States Patent
Matsumora et al.

(10) Patent No.: US 7,029,604 B2
(45) Date of Patent: Apr. 18, 2006

(54) CONDUCTIVE RESIN COMPOSITION AND ELECTRODE SUBSTRATE USING THE SAME AND METHOD OF MANUFACTURING THE ELECTRODE SUBSTRATE

(75) Inventors: Satoru Matsumora, Miyagi-ken (JP); Shunetsu Sato, Miyagi-ken (JP); Toru Sasaki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 342 days.

(21) Appl. No.: 10/305,630

(22) Filed: Nov. 26, 2002

(65) Prior Publication Data
US 2003/0136947 A1 Jul. 24, 2003

(30) Foreign Application Priority Data
Dec. 18, 2001 (JP) .............................. 2001-384013

(51) Int. Cl.
*H01C 10/30* (2006.01)
*H01B 1/23* (2006.01)
(52) U.S. Cl. ...................... 252/514; 252/512; 338/118; 338/160

(58) Field of Classification Search ................ 252/512, 252/513, 514; 338/118, 160
See application file for complete search history.

(56) References Cited

U.S. PATENT DOCUMENTS
3,750,243 A * 8/1973 Prentice ..................... 29/25.35
6,406,774 B1 * 6/2002 Banba et al. ............... 428/139

FOREIGN PATENT DOCUMENTS
JP 57-98572 * 6/1982
JP 5-109573 A * 4/1993
JP 7-247470 9/1995

OTHER PUBLICATIONS
English translation of JP 05-109573 (Apr. 1993).*
English translation of JP 57-098572 (Jun. 1982).*

* cited by examiner

*Primary Examiner*—Mark Kopec
(74) *Attorney, Agent, or Firm*—Beyer,Weaver &Thomas

(57) ABSTRACT

A method of the invention manufactures a conductive resin composition having powdered silver and a reinforcing agent of the Mohs hardness 3.5 to 4.5 contained in binder resin, and forms an electrode substrate by use of the conductive resin composition. Thereby, hardness balance between phosphor copper and an electrode is regulated into the most appropriate state, and a wear resistance of both can be enhanced.

4 Claims, 2 Drawing Sheets

CONDUCTIVE RESIN COMPOSITION AND ELECTRODE SUBSTRATE USING THE SAME AND METHOD OF MANUFACTURING THE ELECTRODE SUBSTRATE

BACKGROUND OF THE INVENTION

1. Field of the Invention

The present invention relates to a conductive resin composition used for an electrode material of a slider-type electronic component such as an encoder, specifically to a conductive resin composition capable of enhancing the wear-resistance between electrodes and sliding contacts to thereby extend the life of the contacts and an electrode substrate using the conductive resin composition, and a method of manufacturing the electrode substrate.

2. Description of the Related Art

In the slider-type electronic component such as an encoder or a variable resistor, the rotating part thereof rotates in a state that the sliding contacts and electrodes (conductive parts) maintain contact with each other, and thereby outputs pulse signals and varies the resistances.

As the sliding contact, a material capable of coming in contact with the electrode with a constant elasticity is preferred, for example, a high-elastic phosphor copper is generally used.

On the other hand, as the electrode side, an electrode is made by a method of applying nickel-plating to the surface of a copper plate, further applying silver-plating to the surface thereof, and thereafter punching it with a press mold, and forming it into a specified shape as the electrode. The electrode thus made is inserted into a metal mold, and is formed together with an insulating molten resin by the insert molding, and is fixed on a resin substrate, thus the electrode substrate is manufactured.

There is another method of forming an electrode by applying a conductive paint(ink) having a conductive resin composition dissolved with an organic solvent on an insulating substrate formed in advance into a specific shape. That is, the paint is made by mixing and dispersing graphite, carbon black, carbon fiber as a conductive filler, and glassy carbon as a wear-resistant reinforcing agent in a resin solution made by dissolving a heat-resisting resin such as phenolic resin, phenol-alkyl resin, or polyimide in an organic solvent; the paint thus made is applied on a substrate of Bakelite or alumina or the like by means of the screen-printing, and thus the electrode is formed.

Since this method facilitates to form the electrode with an arbitrary shape on a substrate, in the case that the production quantity is comparably small and the shape of electrode differs by production lot, the method easily reduces the cost of the electronic component in comparison to the case of manufacturing with the mold.

As mentioned above, the electrode substrate formed by the insert molding with the electrode having nickel-plating applied to the surface of a copper plate disposed in a resin material shows comparably low wear of the electrode by sliding with the sliding contact, because the strength of the electrode is good. However, the method of manufacturing the electrode substrate through the insert molding of the electrode involves complicated processes, and it requires the punching press molds each for the shapes of the electrodes, which swells the production cost. Also, the lead time for making the press molds becomes elongated, which makes it difficult to freely set the shapes of the electrodes.

On the other hand, in the method of forming an electrode on a substrate through the screen-printing, the surface hardness of the electrode thus formed is poor, and the electrode becomes easy to be worn when the sliding contact made of phosphor copper slides on the electrode with oppression. It is also possible to increase the hardness by adding a reinforcing agent such as glassy carbon or the like (more than 5 of the Mohs hardness). However, in the case of an electronic component such that the sliding contact slides on the surface of the electrode, the use of the glassy carbon or the like as the reinforcing agent makes the wear of the sliding contact noticeable, which makes it difficult to maintain the output waveform constant over a long period of time.

SUMMARY OF THE INVENTION

The present invention has been made in order to solve the above conventional problem, and an object of the invention is to provide an electrode substrate that minimizes the wear between a sliding contact and an electrode when the sliding contact slides on the electrode, and a method of manufacturing the electrode substrate.

Another object of the invention is to provide a conductive resin composition for manufacturing the electrode substrate.

The invention is characterized in that the conductive resin composition includes at least binder resin, powdered silver, and a reinforcing agent, and Mohs hardness of the reinforcing agent is 3.5 to 4.5.

Preferably, the conductive resin composition is made with a combination rate of 62 to 73% by volume of the binder resin, 24 to 34% by volume of the powdered silver, and 2 to 5% by volume of the reinforcing agent.

In the above case, preferably, the reinforcing agent is spherical powdered nickel having an average diameter of particles from 3 to 10 μm, or powdered nickel having small spike-like protrusions on a surface thereof.

Or, whiskers (fine fibers) of an inorganic compound having an average length of fibers 10 to 30 μm and an average diameter of fibers from 0.3 to 1.0 μm may be used as the reinforcing agent, and the whiskers of the inorganic compound may employ kalium titanate whiskers or calcium carbonate whiskers.

In the conductive resin composition of this invention, since the average diameter of particles or the average length of fibers of the reinforcing agent is greater than the average diameter (about 3 μm) of particles of the powdered silver, the powdered silver is difficult to be exposed on the surface of the electrode. Accordingly, the sliding contact becomes easy to come into contact with the reinforcing agent, thus minimizing the wear of the resin layer. The reinforcing agent of the Mohs hardness 3.5 to 4.5 has excellent congeniality with phosphor copper, and when the reinforcing agent and the phosphor copper slides each other, the wear of both can be minimized.

Further, the powdered silver is preferably made of at least one kind of spherical powdered silver, dendrite powdered silver, and flake (form) powdered silver.

Since the dendrite powdered silver is capable of having more contacts between particles than the spherical powdered silver, it is able to enhance the conductivity of the conductive resin composition. Since the flake powdered silver is capable of having more areas in the plane direction than the spherical powdered silver, it is able to enhance the conductivity especially in the plane direction. Therefore, it is preferable to use both the spherical powdered silver and the dendrite powdered silver, or to use both the spherical powdered silver and the flake powdered silver, or to mix and use the spherical powdered silver, dendrite powdered silver, and flake powdered silver.

The electrode substrate of the invention is one in which an electrode is formed on a substrate by use of any one of the above conductive resin compositions.

Further, the method of manufacturing the electrode substrate of the invention is characterized by including: the process of producing a conductive paint(ink) by dissolving a binder resin in an organic solvent, mixing in the resin solution at least one kind of spherical powdered silver, dendrite powdered silver, and flake (form) powdered silver with a reinforcing agent; the process of printing an electrode on a substrate by use of the conductive paint; the process of forming the electrode made of a conductive resin composition on the substrate by drying the substrate to remove the organic solvent; and the process of thermal pressing that heats and presses the substrate to smooth a surface of the electrode.

In this case, it is preferred that the applied pressure in the thermal pressing process is 80 to 200 kg/cm$^2$, the heating temperature is 175° C. to 185° C., and the thermal pressing time is 15 seconds to 3 minutes.

DESCRIPTION OF THE PREFERRED EMBODIMENTS

Figure 1:
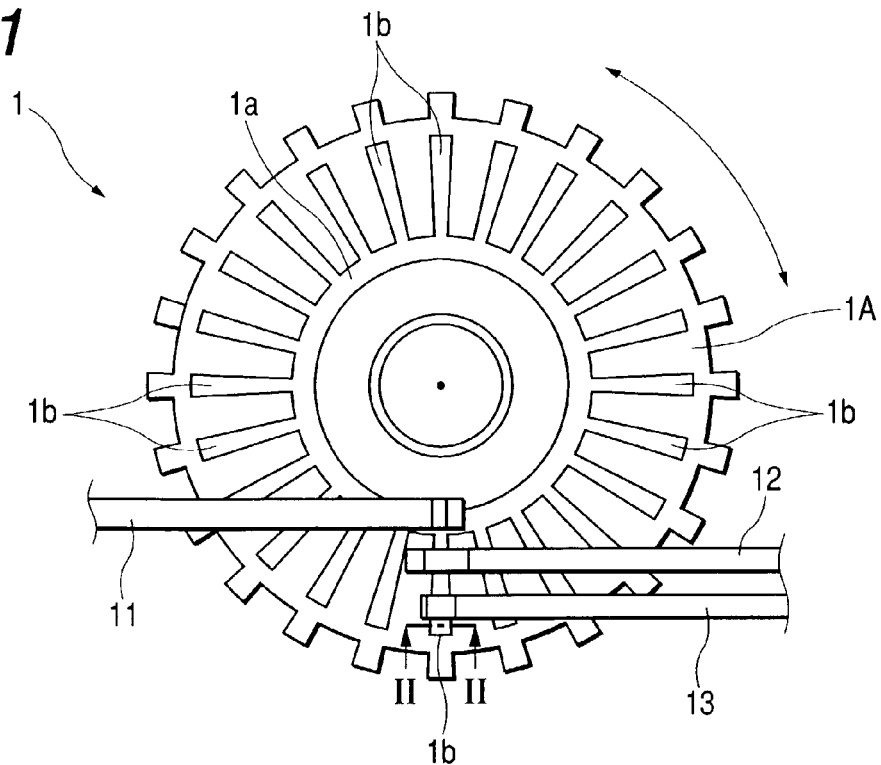
FIG. 1 is a plan view illustrating a major part of an electronic component using the conductive resin composition of the invention.
Figure 2:
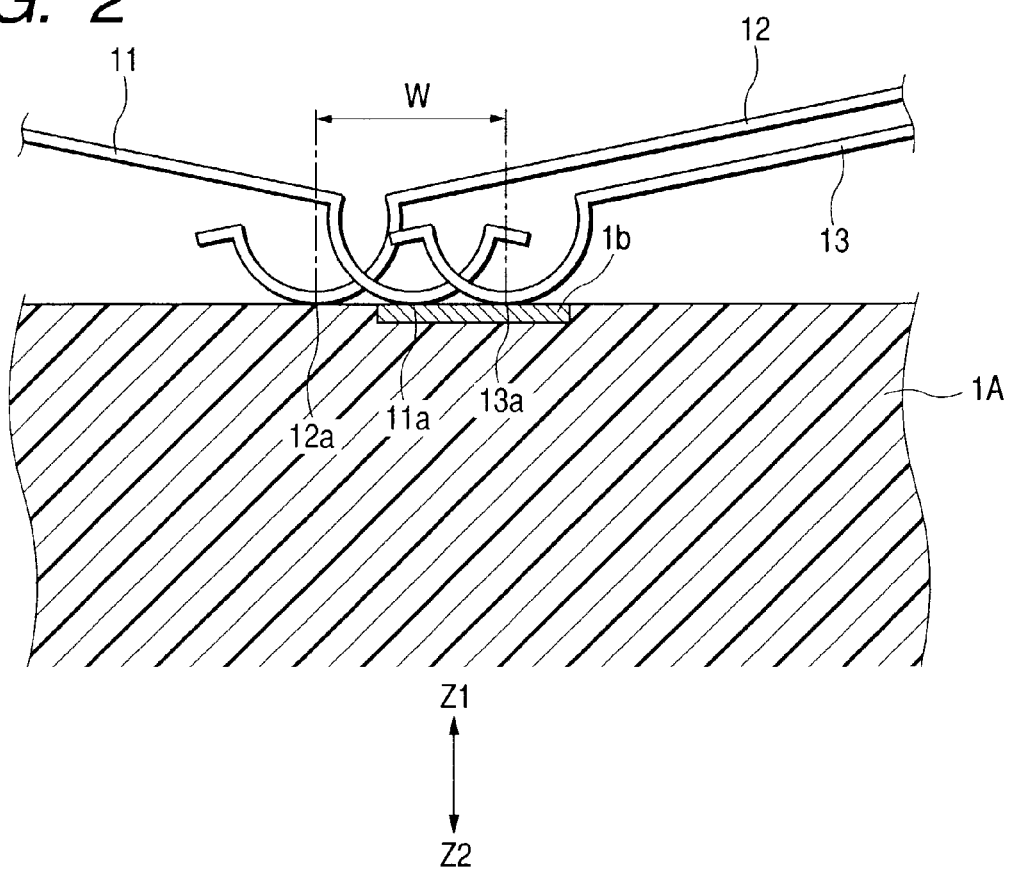
FIG. 2 is an enlarged sectional view taken on the line II—II in FIG. 1.

FIG. 1 is a plan view illustrating a major part of an electronic component using the conductive resin composition of the invention, and FIG. 2 is an enlarged sectional view taken on the line II—II in FIG. 1

The electronic components illustrated in FIG. 1 and FIG. 2 are a rotating part 1 and sliding contacts 11, 12, 13 of an encoder switch.

The rotating part 1 possesses a disk-like substrate 1A and a knob (not illustrated) that extends toward the backside of the drawing from the center of the substrate 1A. The rotating part 1 is supported by a support base (not illustrated) so as to turn clockwise and counterclockwise by turning the knob.

As shown in FIG. 1, there are a circular common electrode 1a and a plurality of detection electrodes 1b, 1b, . . . that radially extend from the common electrode 1a with a constant circumferential pitch, which are integrally formed on the surface of the substrate 1A. That is, the substrate 1A, the common electrode 1a, and the detection electrodes 1b, 1b, . . . constitute an electrode substrate.

The sliding contacts 11, 12, 13 are fixed on a support member not illustrated, and they have substantially circularly curved contacts 11a, 12a, 13a formed on the fronts thereof. The sliding contacts 11, 12, 13 are made by applying nickel plating on the surface of phosphor copper and applying silver plating on the surface thereof, and then bending the front substantially circularly. The sliding contacts 11, 12, 13 have elasticity, and the contacts 11a, 12a, 13a press the surface of the electrode substrate to the Z2 direction in FIG. 2 (toward the backside of the drawing).

That is, the contact 11a of the sliding contact 11 is provided to slide on the surface of the common electrode 1a. The sliding contact 12 is located on the outer circumference to the sliding contact 11, and when the rotating part 1 rotates, the sliding contact 12 slides crossing the detection electrodes 1b, 1b, . . . to the rotating direction. The sliding contact 13 is located on the further outer circumference to the sliding contact 12, and when the rotating part 1 rotates, the sliding contact 13 slides crossing the circumferential fronts of the detection electrodes 1b, 1b, . . . to the rotating direction.

As shown in FIG. 2, the sliding contact 12 is formed longer than the sliding contact 13, and the contact 12a of the sliding contact 12 and the contact 13a of the sliding contact 13 slide on the surface of the substrate 1A and on the detection electrodes 1b, 1b, . . . , with a dislocation of a specific width W along the tangential direction (or rotating direction) of the substrate 1A.

In this type of encoder, when the rotating part (electrode substrate) 1 rotates clockwise, the detection electrodes 1b are first connected to the contact 13a of the sliding contact 13, and then to the contact 12a of the sliding contact 12. And when the rotating part 1 rotates counterclockwise, the detection electrodes 1b are first connected to the contact 12a of the sliding contact 12, and then to the contact 13a of the sliding contact 13.

Therefore, if the sliding contact 11 is set to the ground potential, and the sliding contacts 12, 13 are supplied with a specific voltage through a pull-up resistor (not illustrated) it will be possible to output pulse signals each from the sliding contacts 12 and 13. And, when the both signals are compared, if the output pulse from the sliding contact 12 leads in phase against the output pulse from the sliding contact 13, it is possible to determine that the rotating part 1 rotates counterclockwise; and if the output pulse from the sliding contact 12 delays in phase against the output pulse from the sliding contact 13, it is possible to determine that the rotating part 1 rotates clockwise.

The common electrode 1a and the detection electrodes 1b, 1b, . . . of the rotating part 1 in the encoder are likely to be worn, since the contacts 11a, 12a, 13a of the sliding contacts 11, 12, 13 slide on these electrodes.

Accordingly, various kinds of materials were tested and evaluated in order to select the optimum material as the electrode.

Table 1 and Table 2 show the combinations of various kinds of conductive resin compositions and the results of the evaluation tests. Table 1 shows the case in which spherical particles were used for the reinforcing agent, and Table 2 shows the case in which the reinforcing agent with Mohs hardness confirmed was used.

([Table 1], [Table 2])

The method of manufacturing the electrode substrate made up with the conductive resin composition to be used in the above evaluation tests will be explained.

Figure 3:
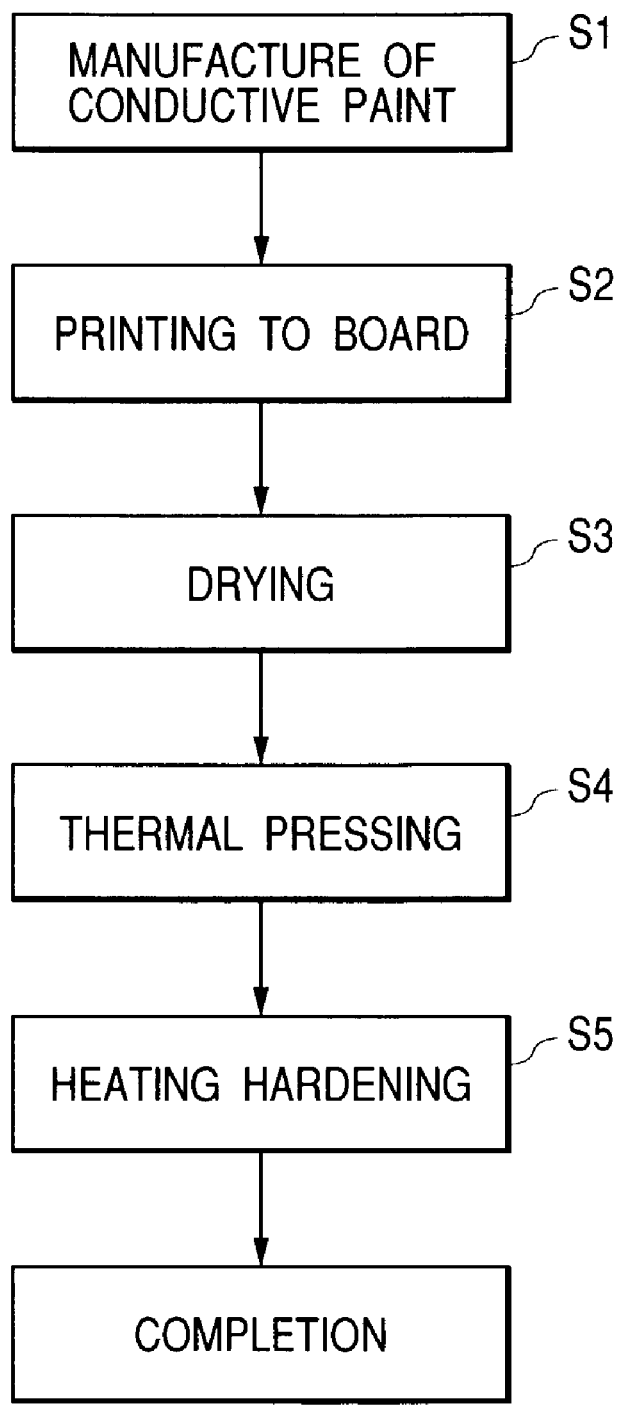
FIG. 3 is a flowchart explaining the manufacturing process of the electrode substrate using the conductive resin composition.

FIG. 3 is a flowchart explaining the manufacturing process of the electrode substrate using the conductive resin composition.

The first step (S1) manufactures a conductive paint (ink) in which the powdered silver having the spherical powdered silver and the dendrite and/or flake powdered silver mixed and the reinforcing agent are dispersed in a resin solution on the basis of the combinations illustrated in Table 1 or Table 2, while the resin solution is made by dissolving the binder resin illustrated in Table 1 or Table 2 in an organic solvent such as the Carbitol. The next step (S2) executes the printing for forming the electrodes (common electrode 1a and detection electrodes 1b), which applies this conductive paint on the surface of the substrate 1A of the rotating part 1 formed of glass-fiber reinforced polyethylene terephthalate and the like by means of the screen-printing method.

The next step (S3) executes the drying for forming the electrodes made of the conductive resin composition, which dries the paint on the substrate 1A to thereby remove the organic solvent from the paint.

The next step (S4) executes, after the drying step of the paint, the thermal pressing that applies heat and pressure to the electrode substrate in order to enhance the conductivity and wear resistance, and the sulfuration resistance of the electrodes. The final step (S5) overheats to harden the paint, thus completing the electrode substrate.

The metal mold used in the thermal pressing step (S4) is made up so as to face a pair of mirrors each other, and the thermal pressing step applies pressure to the electrode substrate while heating between the mirrors of the metal mold, in a state that the electrode substrate is placed between the mirrors for the thermal pressing mold.

Such a thermal pressing step smashes the pinholes and vacant holes made on the electrodes because of the organic solvent being evaporated during the drying after the screen-printing, makes a refined film of the electrodes, and raises the hardness to enhance the wear resistance. At the same time, the step deprives the electrodes of the apertures through which the sulfurated gas such as hydrogen sulfide or sulfurous acid gas gets into; accordingly, it is possible to enhance the sulfuration resistance, also to enhance the conductivity of the electrodes by the contacts or approaches between the dusts of the powered silver.

After the printing and drying steps, even if there are protrusions of the spherical powered silver and the powdered nickel of the reinforcing agent and the like on the surfaces of the electrodes, the thermal pressing step pushes the spherical powered silver with the protrusions inside the electrodes to smooth the surfaces of the electrodes. Provided that the surfaces of the electrodes are smooth, it is possible to prevent noises such as chattering created by the contacts running on the uneven surfaces of the electrodes, which makes it possible to enhance the reliability of the electronic component.

The condition of the thermal pressing step includes the applied pressure of 80 to 200 kg/cm$^2$, the heating temperature of 175° C. to 185° C., and the thermal pressing time of 15 seconds to 3 minutes. The thermal pressing time can be set shorter, as the applied pressure and or the heating temperature are higher.

However, if the heating temperature and/or the applied pressure in the thermal pressing step is significantly high, it will produce a possibility of deforming the electrode substrate; and if the heating temperature and/or the applied pressure is significantly low, it will lead to an impossibility of achieving sufficient smoothness on the surfaces of the electrodes. Also, if the thermal pressing time is significantly long, the electrode substrate will be decomposed by the heat; and if the thermal pressing time is significantly short, it will be impossible to attain sufficient smoothness on the surfaces of the electrodes. Therefore, the optimum condition of the thermal pressing step is regarded to be 150 kg/cm$^2$ of the applied pressure, 180° C. of the heating temperature, and 1 minute of the thermal pressing time.

The reinforcing agent may use, in addition to powdered nickel, kalium titanate whiskers or calcium carbonate whiskers.

The thickness of the electrodes after completion ranges 5 to 25 μm, and the external dimension (diameter) of the substrate 1A is about 20 mm.

The sliding contacts used in the evaluation test were made by applying nickel plating on the phosphor copper and applying silver plating on the surface thereof, and then bending them into the shape as shown in FIG. 2. The radius of the contacts 11a, 12a, 13a of the sliding contacts was about 0.3 mm.

In executing the evaluation test, grease was applied between the electrode substrate and the contacts of the sliding contacts to reduce slide friction.

Encoders were assembled by use of the rotating part 1 provided with the electrode substrate and the sliding contacts; and one clockwise and counterclockwise reciprocating rotation of the rotating part 1 is counted as one round. And, the measurement was made every 30,000 rounds of the reciprocating rotation, and the evaluation about the electrode substrate and sliding contact being good (OK) or not good (NG) was made. The criteria for judging in this case are the following (1) through (3).

(1) Criterion by the Observation of the Output Waveforms

The sliding contact 11 is set to the ground potential, and the sliding contacts 12, 13 are supplied with a specific voltage (for example 5 volts) through a specific pull-up resistance (for example 10 kΩ). When the rotating part 1 rotates, the output waveform between the sliding contacts 11 and 12, and the output waveform between the sliding contacts 11 and 13 are observed on an oscilloscope or the like; when the output waveform shows a normal pulse, the determination is made as "good" (OK), and when the output waveform presents oscillations such as chattering and/or ringing, the determination is made as "not good" (NG).

(2) Criterion by the Observation of the Electrodes

In the observation by sight, when the common electrode 1a and the detection electrodes 1b on the electrode substrate are worn, and the substrate 1A underlying these electrodes is exposed, the determination is made as "not good" (NG).

(3) Criterion by the Wear of the Sliding Contacts

When the wear of the sliding contacts exceeds 20% of the thickness of the contacts (the width 0.235 mm of the worn part against the radius 0.3 mm of the contact), the determination is made as "not good" (NG).

In Table 1 and Table 2, the description of 60,000 rounds NG, for example, shows that it was good (OK) until at least 30,000 rounds.

The evaluation test on the conductive resin composition having powdered nickel combined as the reinforcing agent will be explained.

As shown in Table 1, the conventional example 1 recorded 30,000 rounds NG on the determinations of the output waveform and the electrodes, and the conventional example 2 (Mohs hardness not less than 5) recorded 30,000 rounds NG in the determination of the sliding contacts. That is, when the conventional conductive resin composition was used, the electrodes or the sliding contacts were worn, which confirmed that they had the contact life not more than 30,000 rounds.

On the other hand, the embodiment 1 through the embodiment 13 took on various combinations of the binder resin, powdered silver, and reinforcing agent.

As shown in Table 1, when the conductive resin composition is composed of the combination rate of the binder resin 65 to 73% by volume, powdered silver 24 to 32% by volume, and reinforcing agent 2 to 5% by volume, the test result showed that the contact life was extended to at least more than double (embodiments 1, 3, 4, 5) and at most more than four times (embodiments 2, 6, 9, 10), in comparison to the conventional example.

As the reinforcing agent, the powdered nickel of the Mohs hardness 3.8 should preferably be used, and more preferably the confetti-like powdered nickel, namely, the powdered nickel with spike-like protrusions on the surface should be used (embodiment 2, embodiment 6 through embodiment 13).

Further, the above powdered nickel may be replaced by the spherical particles of the average diameter about 7 to 10 μm (embodiments 3, 4), or the flake powdered silver coated with 15% silver (embodiment 1), or the spherical particles coated with 15% silver (embodiment 5).

The combination rate of the powered nickel is preferably in the range from 2 to 5% by volume, more preferably the range is from 2 to 3.3% by volume (embodiments 2, 6, 9, 19).

And, the comparison examples 1 through 5 in Table 1 show the results of the evaluation test, in the case that materials other than the powdered nickel, for example, the particles of molybdenum, silicon, tungsten, manganese, niobium, and the like were used for the reinforcing agent. When molybdenum particles (comparison example 1) and tungsten particles (comparison example 3) are used for the reinforcing agent, the contact life can be extended compared with the conventional; however in the case of silicon, manganese, niobium, the life is found to be almost the long as the conventional (comparison examples 2, 4, 5).

The evaluation test on the conductive resin composition having the reinforcing agent with confirmed Mohs hardness combined will be explained.

As shown in Table 2, when the conductive resin composition is composed of the combination rate of the binder resin 62 to 70% by volume, powdered silver 24 to 34% by volume, and whiskers (fine fibers) as the reinforcing agent 1.9 to 4.8% by volume, the test result showed that the contact life is extended in comparison to the conventional example (samples 3, 8, 13 to 24).

As the whiskers, preferable is the one whose average length of fibers is 10 to 30 μm, and whose average diameter of fibers is 0.3 to 1.0 μm. As the hardness of the whiskers, the one with the Mohs hardness 3.5 to 4.5 is preferred, which includes, for example, the kalium titanate whiskers and calcium carbonate whiskers, etc. When the Mohs hardness is lower than 3.5, the wear quantity of the electrodes increases, and when the Mohs hardness is higher than 4.5, the wear quantity of the contacts of the sliding contacts increases, which confirms that it becomes difficult in the both cases to extend the contact life of the electronic component.

As the kalium titanate whiskers, the TISMO (product name) marketed from Otsuka Chemical Co. Ltd., for example, can be used. As the calcium carbonate whiskers, the WHISCAL (product name) from Maruo Calcium Co. Ltd., for example, can be used.

Here, the sample 7 shows the test result on the conductive resin composition using the calcium silicate whiskers of the Mohs hardness 4.5 as the reinforcing agent. Since the average length (0.4 μm) of fibers of the whiskers in the sample 7 is extremely short compared with that of the other whiskers, the dusts of the powdered silver appear on the surfaces of the electrodes, and come in direct contact with the sliding contacts. Therefore, the composition does not function as a reinforcing agent in the present invention, and the contact life in this case results in the comparable level as the conventional. That is, it is preferable that the average diameter of particles or the average length of fibers of the reinforcing agent in the present invention is larger than the average diameter of particles of the powdered silver. Therefore, if the average length of fibers of the reinforcing agent in the sample 7 is in the range of 5 to 30 μm, or more preferably 10 to 30 μm, it is conceivable that the contact life can be extended in the same manner as in the samples 6, 15, 25 to 36.

As shown in Table 1 and Table 2, the average diameter of particles (3 to 6 μm) of the spherical powdered silver is smaller than the average diameter of particles (7 to 10 μm) or the average length of fibers (10 to 30 μm) of the reinforcing agent. Therefore, the dusts of the spherical powdered silver are likely to exist inside the electrodes, which makes it easy to prevent contacts with the sliding contacts to thereby reduce wear. Accordingly, mixing the spherical powdered silver will maintain the conductivity of the electrodes 1a, 1b formed of the conductive resin composition.

On the other hand, since the dendrite powdered silver has many contacts between particles, mixing the dendrite powdered silver will enhance the conductivity of the conductive resin composition. And, the flake powdered silver is one that the spherical powdered silver is crushed flat. Since it can take a larger area in the plane direction, mixing the flake powdered silver will enhance the conductivity of the electrodes 1a, 1b in the plane direction.

Thus, as the powdered silver is preferred the one that the dendrite powdered silver and/or the flake powered silver are mixed in addition to the spherical powdered silver.

According to the invention thus described, it is possible to provide the conductive resin composition that minimizes wear when sliding the phosphor copper.

And, forming the electrodes by use of the conductive resin composition will regulate the hardness balance with the sliding contacts of phosphor copper into the most appropriate state, which makes it possible to enhance the wear resistance of both and extend the contact life of the electronic component.

TABLE 1

| Binder resin (% by volume) | | Powdered silver (% by volume) | | | Reinforcing agent (filler) | | | Output % by volume | Wear of electrode wave-form substrates | Wear of contacts by brushing |
|---|---|---|---|---|---|---|---|---|---|---|
| Phenolic resin | Phenoxy resin | Spherical | Dendrite | Flake | Kind | Feature | | | | |
| | Resol phenolic resin | | Average diameter of particles: 3 to 6 μm | Average diameter of secondary particles: 8 to 15 μm, average diameter of primary particles is regarded as less than 1 μm | Average diameter of particles: 1.5 to 3.5 μm | | | | | |
| Conventional example 1 | 60 | | 25 | 15 | | | | | 30,000 rounds NG | 30,000 rounds NG | 30,000 rounds OK |

TABLE 1-continued

| | Binder resin (% by volume) | | Powdered silver (% by volume) | | | Reinforcing agent (filler) | | % by volume | Output wave-form | Wear of electrode substrates | Wear of contacts by brushing |
|---|---|---|---|---|---|---|---|---|---|---|---|
| | Phenolic resin | Phenoxy resin | Spherical | Dendrite | Flake | Kind | Feature | | | | |
| Conventional example 2 | 60 | | 20 | 15 | | Silver coated glassy carbon | Material with silver plating applied to glassy carbon having the average diameter of particles 10 μm to make 50% of silver quantity | 5 | 30,000 rounds OK | 30,000 rounds OK | 30,000 rounds NG |
| Embodiment 1 | 65.01 | | 18.99 | 12.99 | | Silver coated nickel A | Flake powdered nickel of 15% silver plating | 3.01 | 90,000 rounds OK | 90,000 rounds OK | 90,000 rounds NG |
| Embodiment 2 | 65.01 | | 19.00 | 12.99 | | Powdered nickel A | Confetti-like. Average diameter of particles: 3 to 7 μm | 3.00 | 120,000 rounds OK | 120,000 rounds OK | 120,000 rounds NG |
| Embodiment 3 | 65.00 | | 19.00 | 13.01 | | Powdered nickel B | Spherical powered nickel. Average diameter of particles: 7 to 10 μm | 2.99 | 90,000 rounds OK | 90,000 rounds OK | 90,000 rounds NG |
| Embodiment 4 | 65.01 | | 19.00 | 12.99 | | Powdered nickel C | Spherical powered nickel. Average diameter of particles: 8 to 9 μm | 3.00 | 90,000 rounds OK | 90,000 rounds OK | 90,000 rounds NG |
| Embodiment 5 | 65.01 | | 18.99 | 13 | | Silver coated nickel B | Spherical powdered nickel of 15% silver plating | 2.99 | 90,000 rounds OK | 90,000 rounds OK | 90,000 rounds NG |
| Embodiment 6 | 73.00 | | 17.51 | 7.30 | | Powdered nickel A | | 2.19 | 120,000 rounds OK | 120,000 rounds OK | 120,000 rounds OK |
| Embodiment 7 | 59.62 | 6.63 | 19.19 | | 9.93 | Powdered nickel A | | 4.63 | 90,000 rounds OK | 90,000 rounds OK | 90,000 rounds OK |
| Embodiment 8 | 53.70 | 13.41 | 22.83 | | 6.71 | Powdered nickel A | | 3.35 | 90,000 rounds OK | 90,000 rounds OK | 90,000 rounds OK |
| Embodiment 9 | 65.82 | | 22.34 | 4.93 | 4.93 | Powdered nickel A | | 1.97 | 120,000 rounds OK | 120,000 rounds OK | 120,000 rounds OK |
| Embodiment 10 | 58.56 | 6.48 | 18.77 | 12.95 | | Powdered nickel A | | 3.24 | 120,000 rounds OK | 120,000 rounds OK | 120,000 rounds OK |
| Embodiment 11 | 53.00 | 13.24 | 15.89 | 6.61 | 6.61 | Powdered nickel A | | 4.64 | 90,000 rounds OK | 90,000 rounds OK | 90,000 rounds OK |
| Embodiment 12 | 61.28 | 5.63 | 20.36 | 4.24 | 4.24 | Powdered nickel A | | 4.24 | 90,000 rounds OK | 90,000 rounds OK | 90,000 rounds OK |
| Embodiment 13 | 59.64 | 5.28 | 19.12 | 5.98 | 5.98 | Powdered nickel A | | 3.98 | 90,000 rounds OK | 90,000 rounds OK | 90,000 rounds OK |
| Comparison example 1 | 64.99 | | 19.00 | 13.01 | | Molybdenum | Average diameter of particles: 3 μm | 3 | 60,000 rounds OK | 60,000 rounds OK | 60,000 rounds NG |

TABLE 1-continued

| | Binder resin (% by volume) | | Powdered silver (% by volume) | | | Reinforcing agent (filler) | | | Output wave-form | Wear of electrode substrates | Wear of contacts by brushing |
|---|---|---|---|---|---|---|---|---|---|---|---|
| | Phenolic resin | Phenoxy resin | Spherical | Dendrite | Flake | Kind | Feature | % by volume | | | |
| Comparison example 2 | 64.99 | | 19.00 | 12.99 | | Silicon | Average diameter of particles: 5 μm | 3.01 | 30,000 rounds OK | 30,000 rounds OK | 30,000 rounds NG |
| Comparison example 3 | 65.00 | | 19.01 | 13.00 | | Tungsten | Average diameter of particles: 8 μm | 3 | 60,000 rounds NG | 60,000 rounds OK | 60,000 rounds OK |
| Comparison example 4 | 65.01 | | 18.99 | 13.00 | | Manganese | Average diameter of particles: 10 μm | 2.99 | 30,000 rounds OK | 30,000 rounds OK | 30,000 rounds NG |
| Comparison example 5 | 65.01 | | 19.00 | 12.99 | | Niobium | Average diameter of particles: 20 μm | 3 | 30,000 rounds OK | 30,000 rounds OK | 30,000 rounds NG |

*Values show the percentage by volume (% by volume) of solid part after removing solvent.

TABLE 2

| Sample | Binder resin (% by volume) | | Powdered silver (% by volume) | | | Reinforcing agent (filler) | | | Output waveform | Wear of electrode substrates | Wear of contacts by brushing |
|---|---|---|---|---|---|---|---|---|---|---|---|
| | Phenolic resin | Phenoxy resin | Spherical | Dendrite | Flake | Kind | Mohs hardness | % by volume | | | |
| | Resol phenolic resin | | Average diameter of particles: 3 to 6 μm | Average diameter of secondary particles: 8 to 15 μm, average diameter of primary particles is regarded as less than 1 μm | Average diameter of particles: 1.5 to 3.5 μm | | | | | | |
| 1 | 65.00 | | 19.01 | 13.00 | | Titanic black (average diameter of primary particles 0.2 μm) | 7 or more | 3.00 | 60,000 rounds OK | 60,000 rounds OK | 60,000 rounds NG |
| 2 | 65.01 | | 19.00 | 12.99 | | Kalium titanate whiskers | 4 | 3.00 | 90,000 rounds OK | 90,000 rounds OK | 90,000 rounds NG |
| 3 | 65.01 | | 19.00 | 12.99 | | Aluminum borate whiskers A | 7 | 3.00 | 30,000 rounds OK | 30,000 rounds OK | 30,000 rounds NG |
| 4 | 65.01 | | 18.99 | 13.00 | | Powdered aluminum borate A | 7 | 2.99 | 30,000 rounds OK | 30,000 rounds OK | 30,000 rounds NG |
| 5 | 65.01 | | 19.00 | 12.99 | | Graphite B | 2 | 3.00 | 30,000 rounds OK | 30,000 rounds NG | 30,000 rounds OK |
| 6 | 64.99 | | 18.99 | 13.00 | | Graphite C | 2 | 3.01 | 30,000 rounds OK | 30,000 rounds NG | 30,000 rounds OK |
| 7 | 64.99 | | 18.99 | 13.00 | | Calcium silicate whiskers A | 4.5 | 3.01 | 30,000 rounds OK | 30,000 rounds NG | 30,000 rounds OK |
| 8 | 64.99 | | 19.00 | 12.99 | | Calcium carbonate whiskers | 3.5–4.5 | 3.01 | 90,000 rounds OK | 90,000 rounds NG | 90,000 rounds OK |

TABLE 2-continued

| Sample | Binder resin (% by volume) Phenolic resin | Binder resin (% by volume) Phenoxy resin | Powdered silver (% by volume) Spherical | Powdered silver (% by volume) Dendrite | Powdered silver (% by volume) Flake | Reinforcing agent (filler) Kind | Reinforcing agent (filler) Mohs hardness | Reinforcing agent (filler) % by volume | Output waveform | Wear of electrode substrates | Wear of contacts by brushing |
|---|---|---|---|---|---|---|---|---|---|---|---|
| 9 | 65.01 | | 18.99 | 12.99 | | Powdered aluminum borate B | 7 | 3.01 | 30,000 rounds OK | 30,000 rounds OK | 30,000 rounds NG |
| 10 | 64.98 | | 19.00 | 13.01 | | Graphite D | 2 | 3.01 | 30,000 rounds OK | 30,000 rounds NG | 30,000 rounds OK |
| 11 | 65.03 | | 19.00 | 12.99 | | Graphite E | 2 | 2.98 | 30,000 rounds OK | 30,000 rounds NG | 30,000 rounds OK |
| 12 | 65.01 | | 19.00 | 12.99 | | Graphite F | 2 | 3.00 | 30,000 rounds OK | 30,000 rounds NG | 30,000 rounds OK |
| 13 | 67.13 | | 19.45 | 5.03 | 5.03 | Kalium titanate whiskers | 4 | 3.35 | 90,000 rounds NG | 90,000 rounds OK | 90,000 rounds NG |
| 14 | 62.10 | | 21.12 | | 12.43 | Calcium carbonate whiskers | 3.5–4.5 | 4.35 | 90,000 rounds NG | 90,000 rounds NG | 90,000 rounds NG |
| 15 | 64.74 | 7.19 | 17.27 | 3.60 | 3.60 | Calcium carbonate whiskers | 3.5–4.5 | 3.60 | 90,000 rounds OK | 90,000 rounds OK | 90,000 rounds NG |
| 16 | 57.32 | 6.38 | 21.65 | 12.74 | | Kalium titanate whiskers | 4 | 1.91 | 90,000 rounds NG | 90,000 rounds NG | 90,000 rounds NG |
| 17 | 54.80 | 13.70 | 16.44 | 10.27 | | Kalium titanate whiskers | 4 | 4.80 | 90,000 rounds OK | 90,000 rounds OK | 90,000 rounds NG |
| 18 | 52.66 | 13.14 | 19.08 | 6.57 | 6.57 | Calcium carbonate whiskers | 3.5–4.5 | 1.97 | 90,000 rounds NG | 90,000 rounds NG | 90,000 rounds OK |
| 19 | 67.11 | | 16.10 | | 13.43 | Kalium titanate whiskers | 4 | 3.37 | 90,000 rounds OK | 90,000 rounds OK | 90,000 rounds NG |
| 20 | 68.47 | | 19.86 | 6.85 | | Calcium carbonate whiskers | 3.5–4.5 | 4.82 | 90,000 rounds NG | 90,000 rounds NG | 90,000 rounds NG |
| 21 | 63.40 | 7.05 | 16.89 | | 10.55 | Calcium carbonate whiskers | 3.5–4.5 | 2.11 | 90,000 rounds NG | 90,000 rounds NG | 90,000 rounds NG |
| 22 | 59.62 | 6.63 | 22.50 | 3.31 | 3.31 | Kalium titanate whiskers | 4 | 4.63 | 90,000 rounds NG | 90,000 rounds NG | 90,000 rounds NG |
| 23 | 56.39 | 14.06 | 20.40 | | 7.03 | Kalium titanate whiskers | 4 | 2.12 | 90,000 rounds OK | 90,000 rounds OK | 90,000 rounds NG |
| 24 | 52.18 | 13.05 | 22.17 | 9.78 | | Calcium carbonate whiskers | 3.5–4.5 | 2.82 | 90,000 rounds OK | 90,000 rounds OK | 90,000 rounds OK |

*Values show the percentage by volume (% by volume) of solid part after removing solvent.

What is claimed is:

1. An electrode substrate comprising:
a substrate composed of polyethylene terephthalate; and
an electrode composed of a conductive resin composition formed on the substrate,
wherein the electrode slides on a sliding contact, and the conductive resin composition contains at least binder resin, powdered silver, and a reinforcing agent which is powdered nickel having a Mohs hardness of 3.5 to 4.5.

2. The electrode substrate according to claim 1, wherein the conductive resin composition is made with a combination rate of 62 to 73% by volume of the binder resin, 24 to 34% by volume of the powdered silver, and 2 to 5% by volume of the reinforcing agent.

3. The electrode substrate according to claim 1, wherein the reinforcing agent is powdered nickel having small spike-like protrusions on a surface thereof.

4. The electrode substrate according to claim 1, wherein the powdered silver is made of at least one kind of spherical powdered silver, dendrite powdered silver, and flake powdered (form) silver.

* * * * *